(12) United States Patent
Anderson et al.

(10) Patent No.: US 7,009,265 B2
(45) Date of Patent: Mar. 7, 2006

(54) LOW CAPACITANCE FET FOR OPERATION AT SUBTHRESHOLD VOLTAGES

(75) Inventors: Brent A. Anderson, Jericho, VT (US); Andres Bryant, Underhill, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,007

(22) Filed: Jun. 11, 2004

(65) Prior Publication Data

US 2005/0275045 A1    Dec. 15, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/408; 257/327; 257/335; 257/336; 257/342; 257/344; 257/345

(58) Field of Classification Search ......... 257/327, 257/335–336, 342, 344–345, 408
See application file for complete search history.

(56) References Cited

U.S. PATENT DOCUMENTS

| | | | |
|---|---|---|---|
| 4,182,023 A | | 1/1980 | Cohen et al. |
| 5,247,212 A | | 9/1993 | Vinal |
| 5,439,839 A | * | 8/1995 | Jang ............................ 438/303 |
| 5,898,202 A | * | 4/1999 | Fulford et al. .............. 257/408 |
| 5,981,970 A | | 11/1999 | Dimitrakopoulos et al. |
| 6,258,680 B1 | * | 7/2001 | Fulford et al. .............. 438/305 |
| 6,316,302 B1 | * | 11/2001 | Cheek et al. ............... 438/199 |
| 6,344,660 B1 | | 2/2002 | Dimitrakopoulos et al. |
| 6,388,298 B1 | * | 5/2002 | Gardner et al. ............. 257/408 |
| 6,501,134 B1 | * | 12/2002 | Krivokapic .................. 257/350 |
| 6,661,057 B1 | * | 12/2003 | Dawson et al. ............. 257/336 |
| 6,917,085 B1 | * | 7/2005 | Bae et al. .................... 257/408 |

FOREIGN PATENT DOCUMENTS

| EP | 0210625 A2 | 8/1987 |
|---|---|---|
| GB | 2090467 A | 7/1982 |

OTHER PUBLICATIONS

R.C. Dockerty; "Formation of Low Capacitance Diffusions"; IBM Technical Disclosur Bulletin; Aug. 1981; pp. 1743-1744.

* cited by examiner

*Primary Examiner*—Amir Zarabian
*Assistant Examiner*—Ida M. Soward
(74) *Attorney, Agent, or Firm*—Whitham, Curtis & Christofferson, P.C.; William D. Sabo

(57) ABSTRACT

A field effect transistor (FET) has underlap regions adjacent to the channel doping region. The underlap regions have very low dopant concentrations of less than $1\times10^{17}$/cc or $5\times10^{16}$/cc and so tend to have a high resistance. The underlap regions reduce overlap capacitance and thereby increase switching speed. High resistance of the underlap regions is not problematic at subthreshold voltages because the channel doping region also has a high resistance at subthreshold voltages. Consequently, the present FET has low capacitance and high speed and is particularly well suited for operation in the subthreshold regime.

18 Claims, 6 Drawing Sheets ments. Unfortunately, operation in the subthreshold regime reduces the switching speed of the FET. However, it has been discovered that the reduction in switching speed could be more than offset by the allowed increases in device density. In other words, it is possible that the increase in device density and parallelism will more than compensate for the reduced switching speed so that a net increase in processing power is achievable with a subthreshold circuit.

LOW CAPACITANCE FET FOR OPERATION AT SUBTHRESHOLD VOLTAGES

BACKGROUND OF INVENTION

1. Field of the Invention

The present invention relates generally to field effect transistors (FETs). More specifically, the present invention relates to an FET in which source and drain extensions do not overlap the gate electrode. This structure lowers the overlap capacitance, thereby allowing high speed operation at subthreshold voltages.

2. Description of the Prior Art

Field effect transistors (FETs) are commonly used in digital electronics and low power electronics. Presently, power dissipation in FET devices is an important factor limiting the reduction in FET size and increases in device density. As FETs are made smaller and packed closer, the power density of an electronic chip increases rapidly, thereby creating excessive heat and operating temperatures destructive to the chip.

One possible solution to the power dissipation problem is to reduce the operating voltage to levels below what is known as the transistor "threshold" voltage, Vt. FIG. 1 shows a plot illustrating the threshold voltage for a typical conventional FET device. The threshold voltage is the voltage at which the source-drain current transitions from an exponential dependence on gate voltage to a linear or quadratic dependence on gate voltage. For typical FET devices used in microprocessors, the threshold voltage is about 0.2 volts. Conventional FET microprocessor circuits operate at voltages far in excess of the threshold voltage, for example at about 1.2 volts or 5–6 times the threshold voltage. Operating at voltages above threshold provides the substantial advantage of increasing the switching speed of the FET device.

However, operating at relatively high voltages increases the power dissipation of the FET, thereby limiting the device density on a chip. It is well known that power dissipation can be greatly diminished by operating at voltages below the threshold voltage. Operating in the "subthreshold" regime would thereby allow for greater device density and parallelism (e.g. parallelism at the circuit design level). Unfortunately, operation in the subthreshold regime reduces the switching speed of the FET. However, it has been discovered that the reduction in switching speed could be more than offset by the allowed increases in device density. In other words, it is possible that the increase in device density and parallelism will more than compensate for the reduced switching speed so that a net increase in processing power is achievable with a subthreshold circuit.

Therefore, subthreshold operation offers a potential solution to the power dissipation problem of conventional processors. Subthreshold FET processors do not guarantee boosts in processing power, however, because the reduction in switching speed at subthreshold voltages can be large.

FET switching speed is adversely affected by the electrical capacitance ("overlap capacitance") between the gate electrode and the source and drain electrodes.

It would be an advance in the art to provide an FET device having reduced overlap capacitance so that the FET would have greater switching speed in the subthreshold regime. Such an FET could allow subthreshold processor chips to have greater processing power compared to conventional above-threshold processors, and thereby provide a solution to the power dissipation problem that currently limits conventional processors.

SUMMARY OF INVENTION

The present invention includes a field effect transistor having source and drain extensions and a channel doping region disposed between the source and drain extensions. Underlap regions are disposed between the channel doping region and the extensions. The underlap regions have a doping level of less than $1 \times 10^{17}$/cc over a length equal to or greater than a thickness of a gate oxide thickness. The underlap regions reduce overlap capacitance and thereby increase switching speed. At subthreshold voltages, the underlap regions do not substantially increase the total device resistance.

Alternatively, the underlap regions can have dopant concentration of less than $5 \times 10^{16}$/cc or $1 \times 10^{16}$/cc. Also, the underlap regions can have a length of 2, 3, 4, or 5 times the gate oxide thickness or greater. The underlap regions can have a length of about 3–15 nanometers, for example. The underlap regions can have the same or different conductivity type as the channel doping region.

Also, the underlap regions preferably have a resistance of less than 30% (and more preferably less than 20%) of the ON-state resistance of the channel doping region at the threshold voltage.

The present invention includes field effect transistors having only a single underlap region. The single underlap region can be on the source side or drain side of the channel doping region.

The present invention includes an electronic circuit with a field effect transistor having an underlap region and a voltage supply for providing voltage to the field effect transistor to operate it at a voltage less than about 130% or 100% of the threshold voltage.

DETAILED DESCRIPTION

The present invention provides a field effect transistor having undoped or lightly doped underlap regions. The underlap regions are located between the FET channel doping region and source/drain extensions. The underlap regions may have zero doping or doping less than $1 \times 10^{17}$/cc or $5 \times 10^{16}$/cc for example. The underlap regions greatly reduce the overlap capacitance of the present FET, and thereby provide higher switching speed. The under-lapped regions have a relatively high voltage threshold and a relatively high resistance. However, the high resistance of the underlap regions is not problematic because, in sub-threshold operation, the channel doping region resistance is higher than the resistance of the underlap regions. Hence, in subthreshold operation, the underlap regions tend to reduce overlap capacitance and increase switching speed without substantially affecting the total ON-state resistance of the device. The present FET is therefore particularly well suited for operation at subthreshold voltages.

With respect to the drawings, identical elements are noted with identical numbers.

Definitions: Threshold voltage: Threshold voltage is defined as the gate voltage that results in source-drain current approximately equal to 100 nanoAmperes×W/L, where L is the length of the FET channel, and W is the width of the FET channel.

Channel: Region of the FET that experiences band-bending when gate voltage is applied.

Channel doping region: Region of the FET that is doped with the channel dopant. The channel doping region can be longer or wider than the channel.

ON-state: An FET is in the ON-state when a voltage within 10% of the full operating voltage (i.e. the power supply voltage) is applied to the FET gate.

Figure 1:
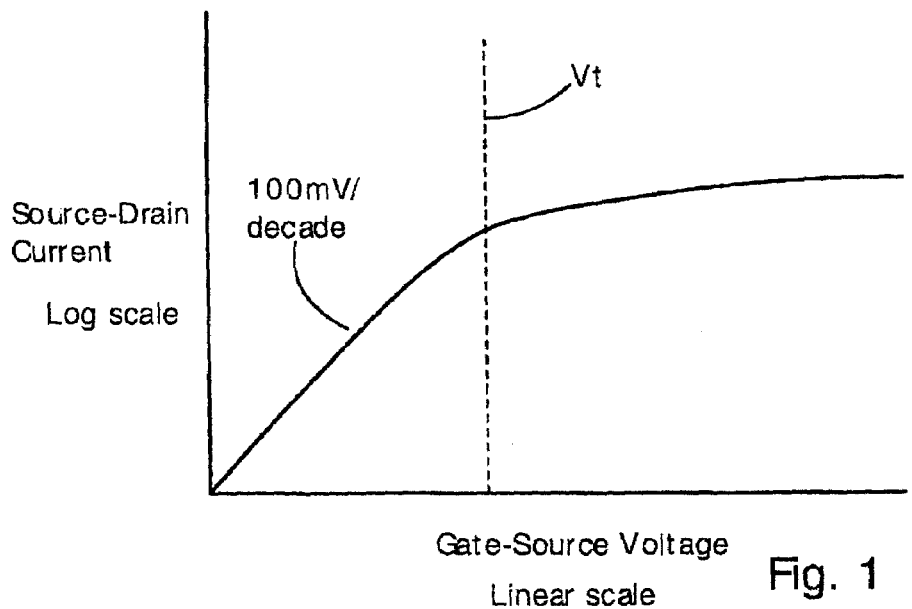
FIG. 1 shows a graphical plot of source-drain voltage versus gate-source voltage for a field effect transistor, illustrating the voltage threshold concept.
Figure 2:
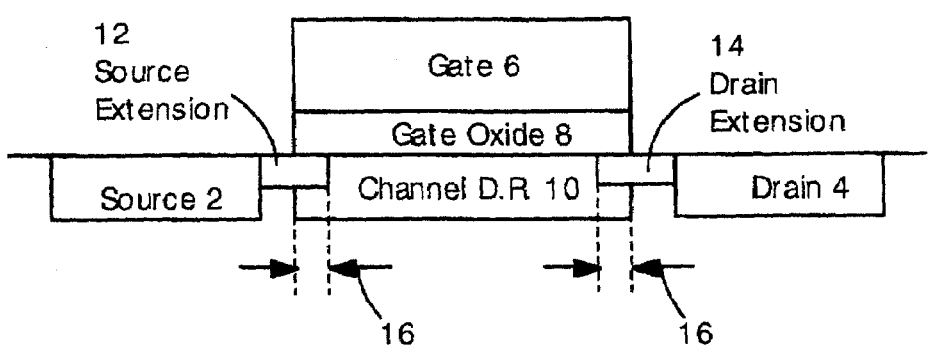
FIG. 2 (Prior Art) shows a conventional FET device with slightly overlapped source and drain extensions.

FIG. 2 shows a conventional field effect transistor FET according to the prior art. The FET has a source diffusion 2 and a drain diffusion 4. A gate 6 is disposed over a channel doping region 10 (channel D. R.). A gate oxide insulator 8 separates the gate 6 from the channel doping region 10. Source extension 12 and drain extension 14 are disposed between the channel doping region 10 and the source and drain. The extensions 12 14 have a high dopant concentration and minimize the resistance between the channel doping region and the source and drain diffusions. It is important to note that conventional FETs have extension overlaps 16. The overlaps are defined as the overlapping regions between the extensions 12 14 and the gate 6. Overlaps provide low resistance electrical contact between the channel doping region and source and drain, but tend to increase the overlap capacitance of the device (i.e. capacitance between the gate and source and drain), and thereby reduce the switching speed. As a result of the high overlap capacitance, the conventional FET of FIG. 2 is poorly suited for operation in the subthreshold regime. In the subthreshold regime, the overlap capacitance created by the overlaps 16 tends to reduce switching speed to an extent that subthreshold circuits with high device density may have lower processing power compared to conventional above-threshold circuits.

Figure 3:
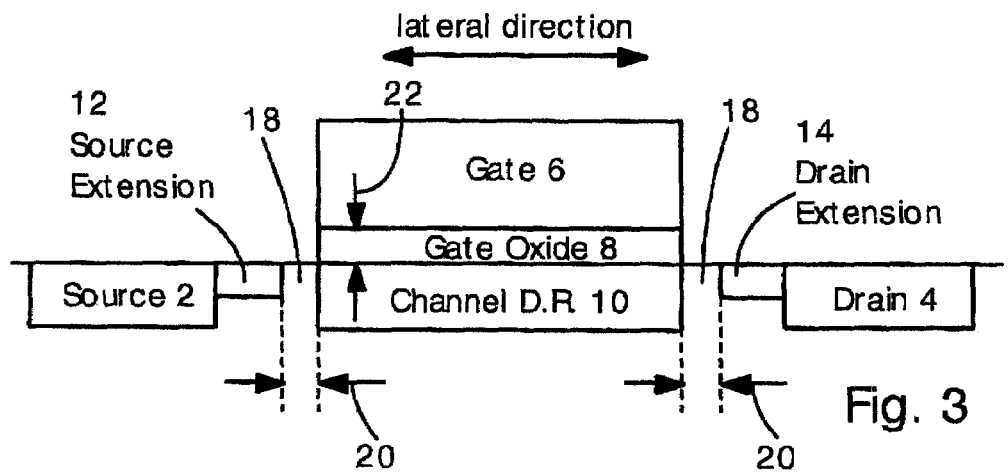
FIG. 3 shows a FET according to the present invention. The FET has underlap regions 18 that have a very low dopant concentration.

FIG. 3 shows an FET according to the present invention. The present FET has the source 2, the drain 4, the source extension 12, the drain extension 14, gate 6 and channel doping region 10. For clarity, sidewall spacers, metal contacts and other FET elements well known in the art are not illustrated.

The present FET can be made in many material systems. For example, the present FET can be made with well-known silicon, silicon-germanium, silicon-on-insulator (SOI) or gallium arsenide technology.

The extensions 12 14 are typically highly doped, low resistance regions with a dopant concentration in the range of $10^{18}$–$10^{20}$/cc. The channel doping region will typically have a dopant concentration in the range of about $5 \times 10^{17}$–$5 \times 10^{18}$/cc. These dopant levels are typical for conventional FET devices and can be typical for the present FET devices.

Significantly, the present FET has underlap regions 18 with dopant concentrations much lower than the dopant concentrations in the extensions 12 14 or channel doping region 10. The underlap regions 18 are defined as regions having a dopant concentration of no more than $1 \times 10^{17}$/cc, or alternatively, $5 \times 10^{16}$/cc or $1 \times 10^{16}$/cc. Preferably, the underlap regions have at least a portion with dopant concentration less than $5 \times 10^{16}$/cc, $5 \times 10^{15}$/cc or $1 \times 10^{15}$/cc. With such low dopant concentrations in the underlap regions 18, the FET will have low overlap capacitance. Also, the underlap regions 18 will tend to have a relatively high resistance and a relatively high threshold voltage. The underlap regions 18 can have the same or different conductivity type as the channel doping region 10. The dopant in the underlap regions can be boron, phosphorus or arsenic, for example, or any other known dopant.

The underlap regions 18 have a lateral thickness 20. The lateral thickness is defined as the length over which the dopant concentration is no more than $1 \times 10^{17}$/cc, or, alternatively, $5 \times 10^{16}$/cc, or $1 \times 10^{16}$/cc. In any case, the lateral thickness is at least as great as a thickness 22 of the gate oxide insulator 8. Alternatively, the lateral thickness may be 2, 3, 4 or more times as great as the gate thickness 22. Gate insulators 8 typically have a thickness in the range of about 1–5 nanometers. The lateral thickness 20 can be in the range of about 1–25 nanometers, but will more typically be in the range of about 3–15 nanometers.

The underlap regions 18 tend to significantly reduce the overlap capacitance of the present FET device. With the extensions located relatively far from the gate, and not directly under the gate, the overlap capacitance is reduced. For example, the overlap capacitance can be reduced by about 30% by the underlap regions 18. Consequently, the switching speed of the present FET is increased. For example, the switching speed can be about 15–20% faster with the underlap regions 18.

It is noted that the threshold voltage tends to increase as lateral thickness 20 of the underlap regions increases. Dopant concentration will also affect the threshold voltage. The threshold voltage of the present field effect transistor can vary widely depending on application, but can be in the range of 0–2 volts, or more typically, 0.1–0.8 volts.

The present FET can be operated in subthreshold or superthreshold regimes. In both subthreshold and superthreshold operation the reduced overlap capacitance tends to increase the switching speed of the present FET.

However, the present FET is particularly well suited for subthreshold operation. In the subthreshold regime, the channel doping region 10 tends to have a greatly increased resistance compared to the superthreshold regime. This is true for any FET device. For example, the ON-state channel doping region resistance in the subthreshold regime can be 10–1000 times higher than in the superthreshold regime. Therefore, in the superthreshold regime, the fixed resistance of the underlap regions 18 will dominate. For example, the overlap regions 18 can have resistance 5–10 times higher than the channel doping region in superthreshold operation. Consequently, the device will exhibit relatively poor switching characteristics and low sensitivity to gate drive in superthreshold operation. However, in subthreshold operation, the channel doping region 10 will have an ON-state channel doping region resistance higher than the underlap regions 18, and the underlap regions 18 will have a proportionately much smaller contribution to the total device resistance. For example, in subthreshold, the underlap regions 18 may each have 1/10, 1/5 or 1/3 the resistance of the channel doping region in the ON state, or a resistance of about 5–30% or 10–20% of the channel doping region (wherein the ON-state resistance is determined at a threshold voltage of the field effect transistor). Therefore, high resistance of the underlap regions 18 will not greatly impair FET performance in subthreshold operation. At the same time, the underlap regions will provide substantially increased switching speed.

The present FETs are preferably employed in circuits designed for use at subthreshold voltages. In typical FET circuits, the "operating voltage" is generally defined as the voltage applied between the gate and source of the FETs. In the present invention, the operating voltage applied between gate and source is preferably in the range of about 50–120% of the threshold voltage, and more preferably in the range of about 70–100% of the threshold voltage. For many typical FET integrated circuits, the operating voltage applied between gate and source will be the same as or slightly lower than the power supply voltage.

The present FET can be operated at voltages slightly above threshold, for example 10%, 20% or 30% above threshold. At such operating voltages, the ON-state channel doping region resistance will still be relatively high, and will typically be higher than the resistance of the underlap regions 18. Hence, the operating characteristics of the present FET will be suitable for many applications even at voltages slightly above threshold.

Figure 4A:
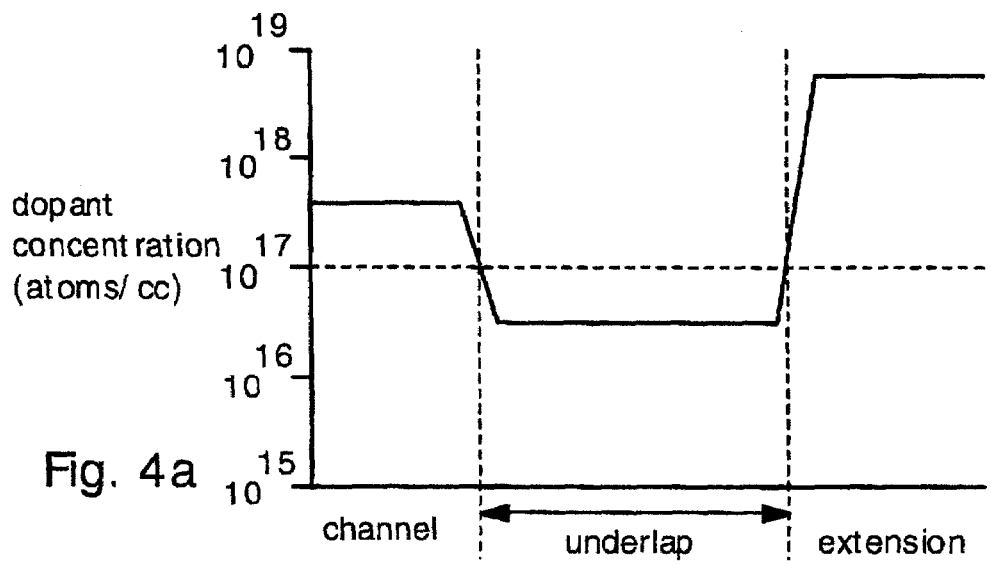
FIGS. 4a–4c show plots of exemplary dopant concentration in the underlap regions.
Figure 4B:
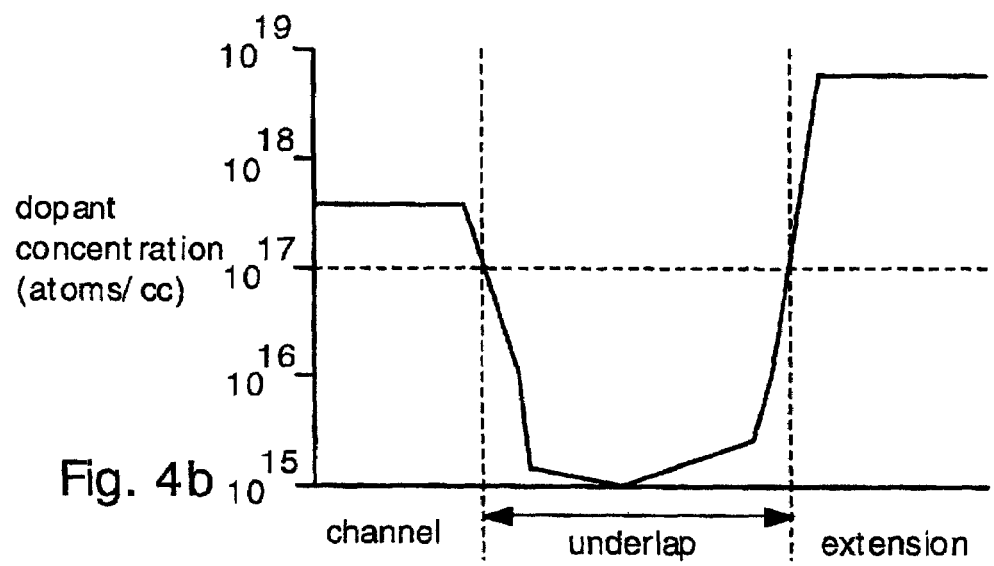
Figure 4C:
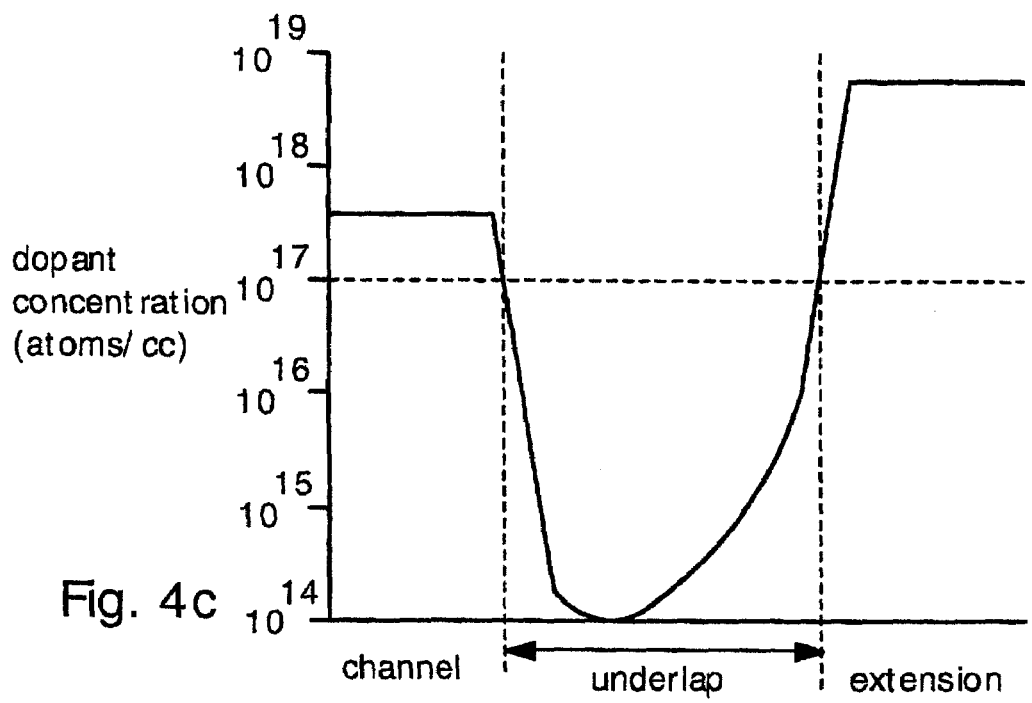

It is noted that the dopant concentration in the underlap regions 18 might not be uniform. For example, the dopant concentraion may be graded across the underlap regions 18 in the lateral direction. In the present invention, the underlap regions must have a dopant concentration of less than $11\times10^{17}$/cc or $5\times10^{16}$/cc over a distance of at least one gate insulator thickness. The dopant concentration within the underlap region may vary provided that it does not exceed $1\times10^{17}$/cc or $5\times10^{16}$/cc. FIGS. 4a, 4b, and 4c for example show several plots of dopant concentration versus lateral position (i.e. doping profiles) for exemplary FETs according to the present invention.

Preferably, the source and drain underlap regions 18 have similar (e.g. symmetrical) doping profiles. They may have the same dopant concentration, dopant type, lateral thickness and dopant grading. Alternatively, the underlap regions 18 have different (e.g. asymmetrical) doping profiles, dopant levels, lateral thicknesses or grading.

Figure 5:
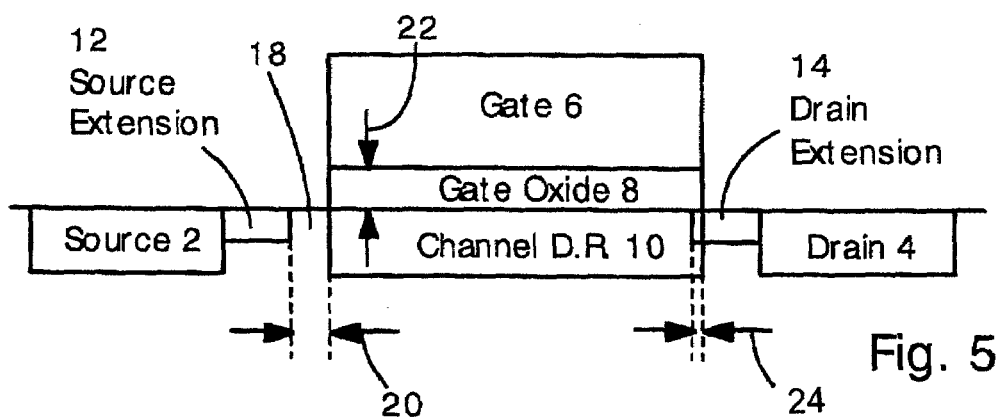
FIG. 5 shows an embodiment of the present FET having only one underlap region.

FIG. 5 shows an embodiment of the invention in which the present FET has only one underlap region 18. The FET of FIG. 5 has a single underlap region 18 between the source extension 12 and the channel doping region 10. The drain extension 14 has a slight overlap 24 with the channel doping region 10. The FET of FIG. 5 will tend to have a slightly higher overlap capacitance compared to FETs with two underlap regions 18. However, the device of FIG. 5 will tend to have lower ON-state resistance and will tend to have better switching characteristics at voltages slightly above threshold. Alternatively, the single underlap region 18 is disposed between the drain extension 14 and the channel doping region 10.

Figure 6:
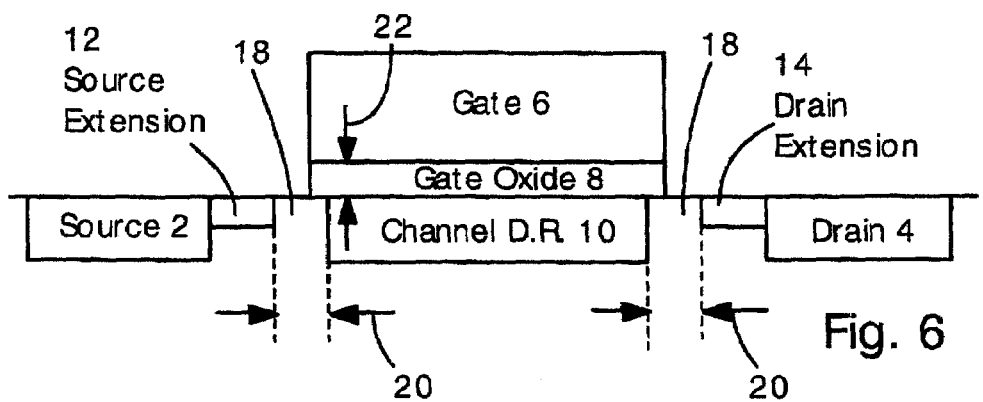
FIG. 6 shows an embodiment of the present FET wherein OLE_LINK29 the underlap regions extend under the gate.

FIG. 6 shows an alternative embodiment in which the channel doping region 10 is narrower than the gate 6. The underlap regions 18 extend under the gate 6. In the present invention, it is preferable for the extensions 12 14 to not extend under the gate 6 as this would increase the overlap capacitance and reduce switching speed.

Figure 7:
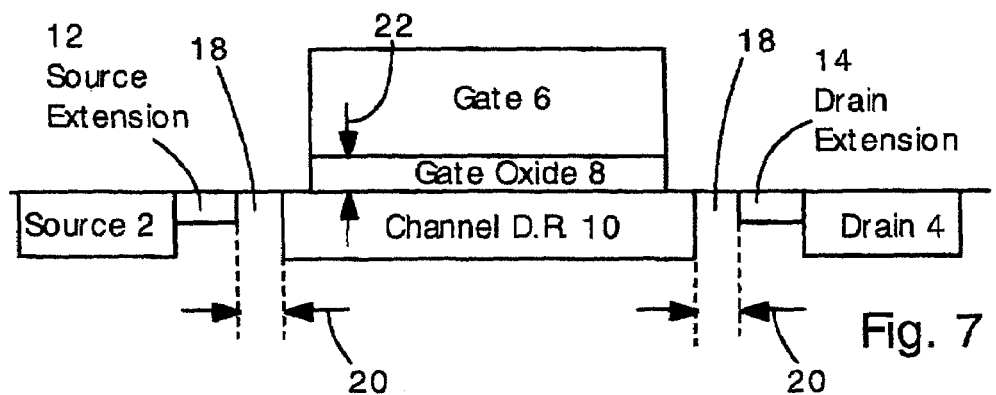
FIG. 7 shows an embodiment of the present FET wherein the channel doping region is wider than the gate.

FIG. 7 shows an alternative embodiment in which the channel doping region 10 is wider than the gate 6. In this embodiment, the ends of the channel doping region 10 will be less affected by gate voltage, and, consequently, the channel doping region 10 may have a higher threshold voltage.

Figure 8:
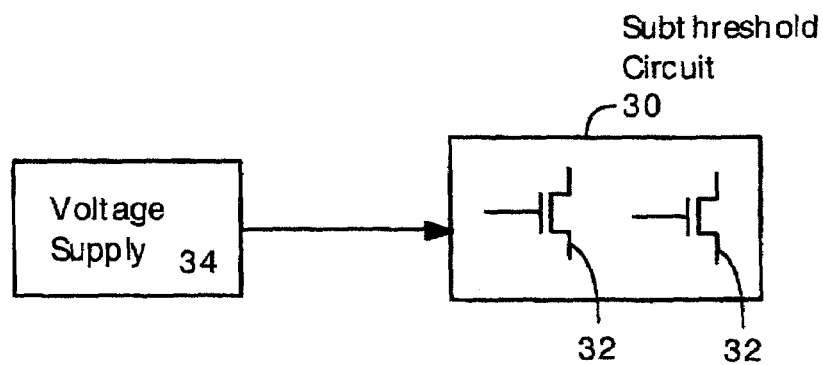
FIG. 8 shows an electronic circuit according to the present invention having a field effect transistor with an underlap region.

FIG. 8 shows a schematic illustration of an electronic apparatus according to the present invention. The apparatus has a subthreshold circuit 30 containing field effect transistors 32 having underlap regions according to the present invention. The circuit 30 is connected to a voltage supply 34 supplying electrical power so that the FETs 32 are operated at a voltage slightly above or lower than a threshold voltage of the field effect transistors 32. For example, the voltage supply can supply voltage of less than about 130%, 100% or 70% of the threshold voltage of the FETs 32, or in the range of 70–130% of the threshold voltage. Preferably, the FETs 32 have approximately the same threshold voltage. The subthreshold circuit can be any digital or analog circuit such as a microprocessor, application-specific integrated circuit (ASIC), digital signal processor (DSP) or the like.

FIGS. 9a–9f illustrate an exemplary method for making the present field effect transistor. The method of FIGS. 9a–9f is merely exemplary and is not intended to limit the invention. Other methods for making the present FET are possible.

Figure 9A:
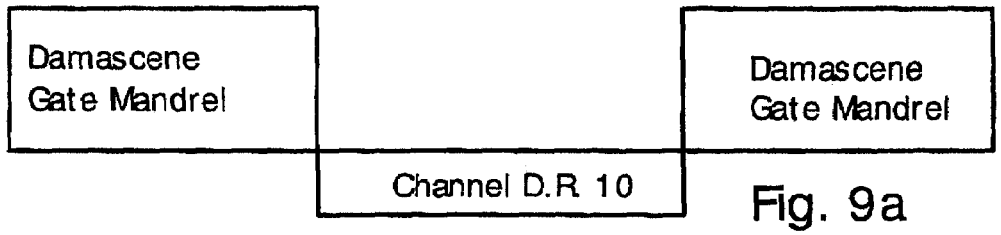
FIGS. 9a–9f illustrate an exemplary method for making the present field effect transistor.

FIG. 9a: A damascene gate mandrel 40 is deposited and patterned as known in the art. The channel doping region 10 is formed by diffusion and/or ion implantation.

Figure 9B:
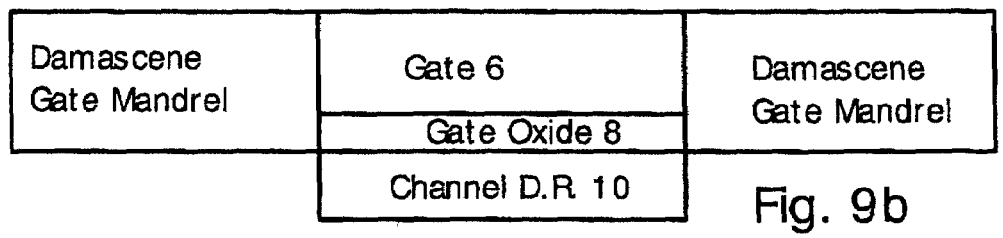

FIG. 9b: The gate insulator oxide 8 and gate are deposited. The damascene gate mandrel determines the size and location of the gate insulator 8 and gate.

Figure 9C:
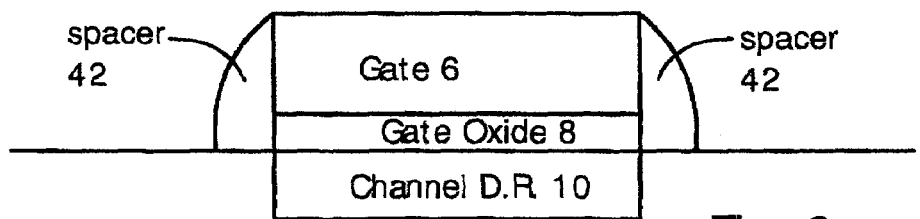

FIG. 9c: The damascene gate mandrel is removed. Spacers 42 are deposited, as known in the art.

Figure 9D:
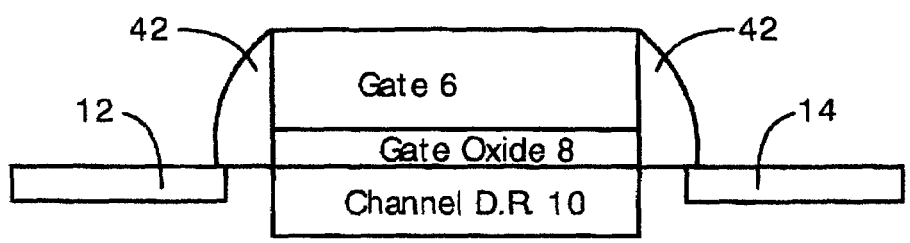

FIG. 9d: Source and drain extensions 12 14 are formed by diffusion and/or ion implantation. The spacers 42 are wide enough to ensure that the extensions 12 14 do not overlap the channel doping region 10.

Figure 9E:
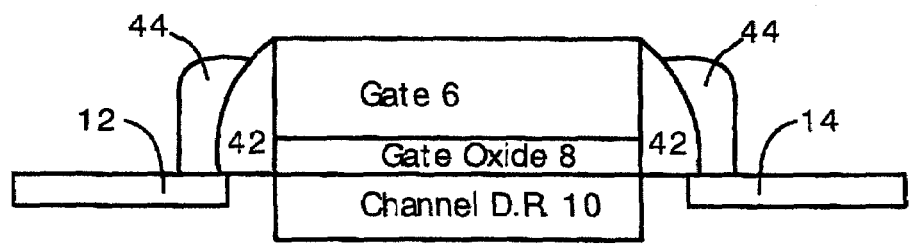

FIG. 9e: Spacers 44 are formed on spacers 42.

Figure 9F:
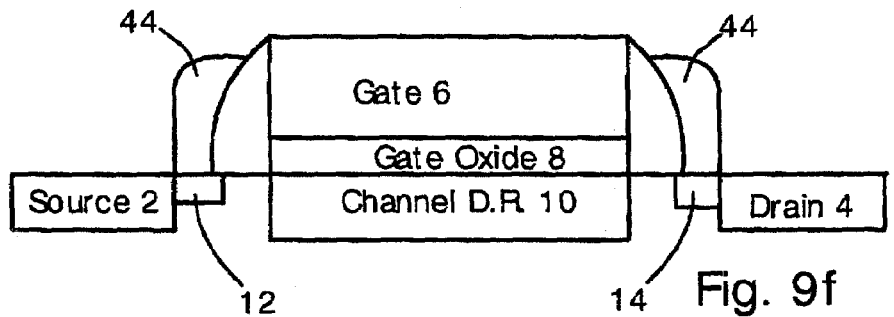

FIG. 9f: Source and drain deep diffusions are formed.

Subsequent to FIG. 9f, suicides and electrical wiring layers can be formed, as known in the art.

Figure 10:
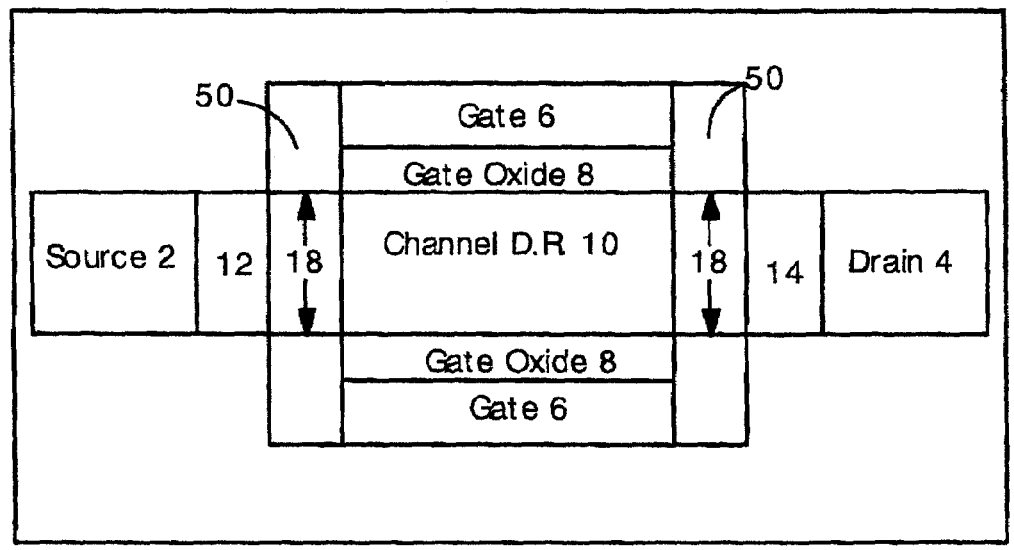
FIG. 10 shows a dual gate finFET with underlap regions according to the present invention.

FIG. 10 shows a top view of an embodiment of the present FET having a dual-gate finFET structure. Dual gates 6 are disposed on opposite sides of the channel doping region 10. Underlap regions 18 are disposed between the extensions 12 14 and the channel doping region 10. The finFET with underlap regions 18 can be made by using the spacer masking technique illustrated in FIGS. 9a–9f. In this case, spacers 50 will be present on top of the underlap regions 18. More details of a spacer technique for making finFETs is provided in U.S. published patent application 2003/0057486A1, which is hereby incorporated by reference.

It will be clear to one skilled in the art that the above embodiment may be altered in many ways without departing from the scope of the invention. Accordingly, the scope of the invention should be determined by the following claims and their legal equivalents.

What is claimed is:

1. A field effect transistor comprising:
   a) a channel doping region;
   b) a gate insulator disposed above the channel doping region;
   c) a gate electrode disposed above the gate insulator; and
   d) at least one underlap region adjacent to the channel doping region positioned between either a source extension or a drain extension and said channel doping region which does not underlap the boundaries of the gate electrode, wherein either a resistance of said underlap region is no more 30% of an ON-state resistance of said channel doping region, or the underlap region has a doping level no more than $1\times10^{17}$/cc over a lateral thickness equal to or greater than a thickness of the gate insulator.

2. The field effect transistor of claim 1, further comprising a source extension and a drain extension, and wherein said at least one underlap region includes a first underlap region positioned between said source extension and said channel doping region and a second underlap region positioned between said drain extension and said channel doping region.

3. The field effect transistor of claim 1 wherein the at least one underlap region has a doping level less $5\times10^{16}$/cc over a lateral thickness equal to or greater than a thickness of the gate insulator.

4. The field effect transistor of claim 1 wherein the at least one underlap region has a doping level less than $1\times10^{15}$/cc over a lateral thickness equal to or greater than a thickness of the gate insulator.

5. The field effect transistor of claim 1 wherein the at least one underlap region has a doping level less than $5\times10^{16}$/cc over a lateral thickness equal to or greater than twice a thickness of the gate insulator.

6. The field effect transistor of claim 1 wherein the at least one underlap region has a doping level less than $1\times10^{15}$/cc over a lateral thickness equal to or greater than twice a thickness of the gate insulator.

7. The field effect transistor of claim 1 wherein the at least one underlap region has a lateral thickness in the range of 3–15 nanometers.

8. The field effect transistor of claim 1 wherein the at least one underlap region has a resistance of less than about 20% of an ON-state resistance of the channel doping region.

9. The field effect transistor of claim 1 wherein the at least one underlap region has a resistance of less than about 15% of an ON-state resistance of the channel doping region.

10. The field effect transistor of claim 1 wherein the at least one underlap region has the same conductivity type as the channel doping region.

11. The field effect transistor of claim 1 wherein the at least one underlap region has the opposite conductivity type as the channel doping region.

12. The field effect transistor of claim 1 wherein the field effect transistor is a finFET.

13. The field effect transistor of claim 1 wherein the channel doping region is narrower than the gate.

14. An electronic circuit, comprising:
 a) at least one field effect transistor comprising:
  a channel doping region;
  a gate insulator disposed above the channel doping region;
  a gate electrode disposed above the gate insulator;
  at least one underlap region adjacent to the channel doping region positioned between either a source extension or a drain extension and said channel doping region which does not underlap the boundaries of the gate electrode, wherein either
   a resistance of said underlap region is no more than 30% of an ON-state resistance of said channel doping region, or
   the underlap region has a doping level no more than $1\times^{17}$/cc over a lateral thickness equal to or greater than a thickness of the gate insulator; and
 b) a voltage supply operable for providing voltage to the field effect transistor so that the field effect transistor is operated with a gate voltage of less than about 130% of a threshold voltage.

15. The electronic circuit of claim 14 wherein the voltage supply is operable for providing voltage to the field effect transistor so that the field effect transistor is operated with a gate voltage of less than about 100% of the threshold voltage.

16. The electronic circuit of claim 14 wherein the voltage supply is operable for providing voltage to the field effect transistor so that the field effect transistor is operated with a gate voltage of less than about 80% of the threshold voltage.

17. The electronic circuit of claim 14 wherein said at least one field effect transducer comprises a plurality of field effect transducers wherein each of the plurality of field effect transducers have the same threshold voltage to within about 10%.

18. The electronic circuit of claim 14 wherein the field effect transistor has two underlap regions, with one underlap region on each side of the channel doping region.

* * * * *